(12) United States Patent
Hellings et al.

(10) Patent No.: US 9,263,401 B2
(45) Date of Patent: Feb. 16, 2016

(54) SEMICONDUCTOR DEVICE COMPRISING A DIODE AND A METHOD FOR PRODUCING SUCH A DEVICE

(71) Applicant: IMEC, Leuven (BE)

(72) Inventors: Geert Hellings, Heverlee (BE); Mirko Scholz, Leuven (BE); Dimitri Linten, Boortmeerbeek (BE)

(73) Assignee: IMEC, Leuven (BE)

( * ) Notice: Subject to any disclaimer, the term of this patent is extended or adjusted under 35 U.S.C. 154(b) by 35 days.

(21) Appl. No.: 14/066,545

(22) Filed: Oct. 29, 2013

(65) Prior Publication Data
US 2014/0124894 A1    May 8, 2014

(30) Foreign Application Priority Data
Oct. 29, 2012    (EP) .................................... 12190455

(51) Int. Cl.
*H01L 23/60* (2006.01)
*H01L 29/36* (2006.01)
(Continued)

(52) U.S. Cl.
CPC ............ *H01L 23/60* (2013.01); *H01L 27/0255* (2013.01); *H01L 29/0688* (2013.01);
(Continued)

(58) Field of Classification Search
CPC . H01L 23/60; H01L 29/0688; H01L 29/0649; H01L 29/36; H01L 29/66234; H01L 29/6609; H01L 29/66098; H01L 29/66106; H01L 29/7302; H01L 29/866; H01L 27/0255
See application file for complete search history.

(56) References Cited

U.S. PATENT DOCUMENTS

| 5,644,167 A | 7/1997 | Weiler et al. |
| 6,586,317 B1 | 7/2003 | Vashchenko et al. |

(Continued)

FOREIGN PATENT DOCUMENTS

| EP | 0 426 241 | 5/1991 |
| EP | 1 355 363 | 10/2003 |

OTHER PUBLICATIONS

Chen, et al., "Diode-Triggered Silicon-Controlled Rectifier with Reduced Voltage Overshoot for CDM ESD Protection", IEEE Transactions on Device and Materials Reliability, vol. 12, No. 1, Mar. 1, 2012, pp. 10-14.

(Continued)

*Primary Examiner* — Victor A Mandala
*Assistant Examiner* — Quovaunda V Jefferson
(74) *Attorney, Agent, or Firm* — Knobbe, Martens, Olson & Bear LLP (57) ABSTRACT

The disclosed technology relates to a semiconductor device comprising a diode junction between two semiconductor regions of different doping types. In one aspect, the diode comprises a junction formed between an upper portion of an active area and a remainder of the active area, where the active area is defined in a substrate between two field dielectric regions. The upper portion is a portion of the active area that has a width smaller than a width of the active area itself. In another aspect, the semiconductor device is an electrostatic discharge protection device (ESD) comprising such a diode. In addition, the active area has a doping profile that exhibits a maximum value at the surface of the active area, and changes to a minimum value at a first depth, where the first depth can be greater in value than half of a depth of the upper portion. In another aspect, a method of fabrication the device does not require a separate ESD implant for lowering the holding voltage and can allow for a reduction in the number of processing steps as well as other devices comprising a diode junction.

11 Claims, 5 Drawing Sheets

(51) Int. Cl.
  *H01L 29/66* (2006.01)
  *H01L 29/866* (2006.01)
  *H01L 29/73* (2006.01)
  *H01L 27/02* (2006.01)
  *H01L 29/06* (2006.01)

(52) U.S. Cl.
  CPC ............ *H01L29/36* (2013.01); *H01L 29/6609* (2013.01); *H01L 29/66098* (2013.01); *H01L 29/66106* (2013.01); *H01L 29/66234* (2013.01); *H01L 29/7302* (2013.01); *H01L 29/866* (2013.01); *H01L 29/0649* (2013.01); *H01L 2924/0002* (2013.01)

(56) References Cited

U.S. PATENT DOCUMENTS

2007/0215978 A1   9/2007  Stricker et al.
2008/0121988 A1*  5/2008  Mallikararjunaswamy et al. ............................ 257/328
2008/0311723 A1  12/2008  Voldman
2009/0079022 A1   3/2009  Keena et al.

OTHER PUBLICATIONS

Hurwitz, et al. "Integration of SiGE NPN Devices with Tunable Collector Profiles Using a Single Mask", IEEE BCTM 11.2, 2008, pp. 170-173.

Semenov, et al., "ESD Protection Design for I/O Libraries in Advanced CMOS Technologies", Solid State Electronics, vol. 52, 2008, pp. 1127-1139.

European Search Report dated Mar. 13, 2013 for European Application EP 12 19 0455.

* cited by examiner

SEMICONDUCTOR DEVICE COMPRISING A DIODE AND A METHOD FOR PRODUCING SUCH A DEVICE

CROSS-REFERENCE TO RELATED APPLICATIONS

This application claims foreign priority to European patent application EP 12190455.1 filed on Oct. 29, 2012, the contents of which is incorporated by reference herein in its entirety.

BACKGROUND OF THE INVENTION

1. Field of the Invention

The disclosed technology is relates generally to a semiconductor device including a diode, which can be integrated in integrated circuit packages provided with Electrostatic Discharge (ESD) protection on an interposer chip.

2. Description of the Related Technology

As a cost-reducing measure in IC-packaging, it is known to produce electrostatic discharge protection circuitry on the interposer chip instead of on the IC's themselves. This is described for example in document U.S. Pat. No. 5,644,167 and may be referred to as the introduction of an 'active interposer'. An advantage of this approach is that the processing cost of the IC package is reduced. As a larger area is available on the interposer, older CMOS technology manufacturing nodes can be applied on the interposer, leading to a further cost reduction, e.g. 65 nm node technology is used on the interposer compared to 32 nm node or less on the IC's.

However, the IC-packaging industry continues to look for improvements in terms of cost-effectiveness of the applied processes. ESD protection devices are major examples of semiconductor devices comprising a diode junction. For this type of device, as for others comprising a diode junction, an optimization is needed in terms of the process technology itself, such as the number of process steps and the number of lithography masks applied in the process, in order to further obtain a cost reduction in the production of such devices, for example on an interposer chip.

SUMMARY OF CERTAIN INVENTIVE ASPECTS

The disclosed technology relates to optimizing the fabrication of a diode structure in a semiconductor device, such as an ESD protection device, possibly making the device more cost-effective to produce in general and particularly for making them on an interposer chip. In one aspect, the diode comprises a junction formed between an upper portion of an active area and a remainder of the active area, where the active area is defined in a substrate between two field dielectric regions. The upper portion is a portion of the active area that has a smaller width than a width of the active area itself. In another aspect, the semiconductor device is an electrostatic discharge protection device (ESD) comprising such a diode. In addition, the active area has a doping profile that exhibits a maximum value at the surface of the active area, and changes to a minimum value at a first depth, where the first depth can be greater in value than half of a depth of the upper portion. In another aspect, a method of fabrication the device does not require a separate ESD implant for lowering the holding voltage and can allow for a reduction in the number of processing steps as well as other devices comprising a diode junction.

In one aspect, a semiconductor device includes a bulk substrate area and a plurality of field dielectric regions formed over the bulk substrate area. The device additionally includes a plurality of active areas formed between adjacent field dielectric regions, wherein at least a part of one of the active areas and at least a part of the bulk substrate area are formed of a material of a first doping type. The device additionally includes an upper portion formed in the one of the active areas and formed of a material of a second doping type opposite to the first doping type, where the upper portion has a width smaller than a width of the active area. A diode is formed in the active area of the device, and includes a junction formed between the upper portion of the active area and a remainder of the active area, where the upper portion is connected to a first terminal and the remainder of the active area is connected to a second terminal. The remainder of the active area and the bulk substrate area have a doping profile of the first doping type such that the doping level has a first maximum value at a surface of the active area and changes to a minimum value at a first depth within the active area.

According to one embodiment, the second terminal is connected to the surface of the remainder of the active area. According to another embodiment, the active area is a first active area, and the second terminal is connected to the surface of a second active area of the same doping as the first active area.

According to an embodiment, the profile is such that the doping level again changes to a second maximum value, at a higher depth than the minimum, the second maximum preferably being reached at a depth lying within the bulk substrate area.

The device of the invention may be an ESD protection device comprising the diode and a bipolar transistor, arranged to conduct current from an ESD terminal to ground after the diode has gone into breakdown mode, the emitter and collector of the transistor being respectively formed by two areas of the same doping type as the upper portion of the (first) active area, the two areas that form the emitter and collector being formed respectively in two further active areas.

According to an embodiment, the device is located on an interposer substrate on which one or more integrated circuit chips are mounted, the ESD protection device being configured to protect an electrical connection of an IC from electrostatic discharge.

The semiconductor may be silicon, the upper portion being n-doped and the remainder of the (first) active area being p-doped.

According to an embodiment, the depth at which the minimum doping level is reached is higher than half the depth of the upper portion.

The invention is also related to a method for fabricating a semiconductor device comprising a diode, comprising providing a semiconductor substrate and forming a plurality of field dielectric regions and at least one active area between two adjacent field dielectric regions, where the at least one active area and the field dielectric regions are formed over a bulk substrate area. The method additionally includes forming an area of a first doping type in the substrate, the area comprising the at least one active area and the bulk substrate area. The method additionally includes forming an upper portion of a second doping type opposite to the first doping type in the one of the active areas, where the upper portion has a width smaller than a width of the at least one active area. The method additionally includes connecting the upper portion to a first terminal and connecting a remainder of the active area to a second terminal, where a diode is formed by at least part of a junction formed between the upper portion and the remainder of the active area. Forming the area of the first doping type comprises implanting the substrate with dopants of the first type to create a doping profile in the active area and the bulk substrate area, such that the doping level has a first maximum value at a surface of the active area and changes to a minimum level at a first depth within the active area.

According to an embodiment of the method, the second terminal is connected to the surface of the remainder of the active area. According to another embodiment of the method, the active area is a first active area, and the second terminal is connected to the surface of a second active area of the same doping as the first active area.

According to an embodiment, the profile is such that the doping level again changes to a second maximum value, at a higher depth than the minimum, the second maximum preferably being reached at a depth lying within the bulk substrate area.

In the method of the invention, the device may be an ESD protection device comprising a diode and a bipolar transistor, the emitter and collector being respectively formed in two further active areas, wherein in the deposition step, ions of the opposite type are deposited in the further active areas to form the emitter and collector.

According to an embodiment, the step of producing connections from active areas to the terminals comprises a pre-metal dielectric deposition and patterning step to form contact holes, a contact formation step by filling the holes with a contact metal, and a silicidation step for forming silicide areas between the active areas and the contact metal, wherein the silicidation step is performed after the PMD patterning step and before the contact formation step.

According to an embodiment of the method, the depth at which the minimum doping level is reached is higher than half the depth of the upper portion.

DETAILED DESCRIPTION OF CERTAIN ILLUSTRATIVE EMBODIMENTS

A few definitions are given which are applicable to certain terminology used in the description. An active area is an area at and near the surface of a semiconductor substrate where devices (transistors, diodes, etc) are produced. Adjacent active areas can be separated by field dielectric regions, for example produced by Shallow Trench Isolation. The width of an active area is the distance between the two field regions between which the active area is located (measured perpendicularly to the edge of the field regions).

Figure 1:
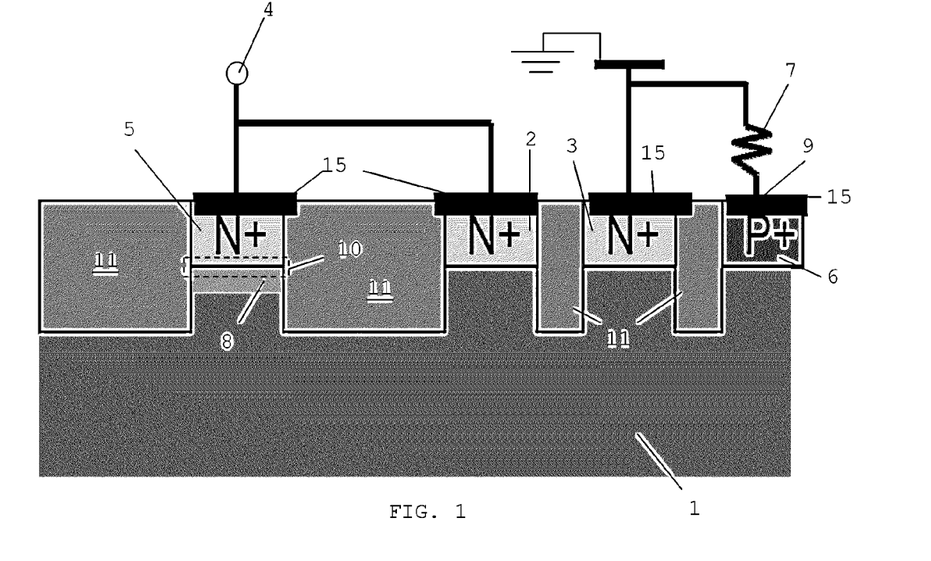
FIG. 1 illustrates a cross-sectional view of an ESD protection device.

By way of example, the structure and fabrication method is hereafter described of an ESD protection device known as a 'diode-triggered npn'. The structure of such a device as known in the art is described and then compared to the structure and its fabrication method according to an embodiment. FIG. 1 shows the basic structure of this type of ESD protection device as it is presently known in the art. In a p-doped silicon substrate 1 (this may be a p-well created in a lowly doped or undoped Si-substrate, or in an n-well itself created in a p-well or p-substrate), an npn bipolar transistor is formed by n-doped active areas 2 and 3, acting as the emitter and collector of the npn, with the bulk area of the p-substrate acting as the base. The first n-doped active area 2 is connected to an ESD terminal 4, which is itself connected to a further n-doped active area 5. The second n-doped active area 3 is connected to ground, while the p-substrate is provided with a highly p-doped active area 6, connected to ground via a resistor 7. The active areas are separated by field dielectric (usually oxide) regions 11. All regions connected to external contacts are provided with silicide contact areas 15, obtainable by silicidation (e.g. by deposition of Ni and formation of Nickel silicide).

Figure 2:
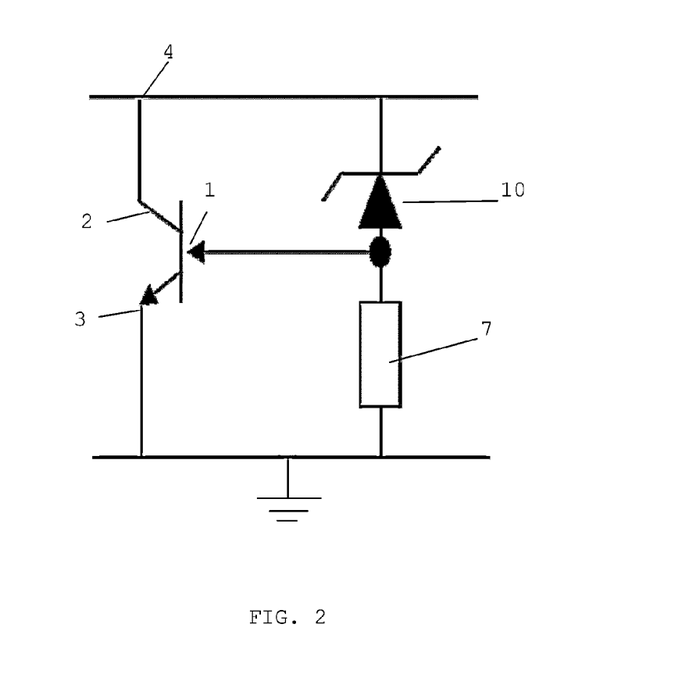
FIG. 2 illustrates the electrical equivalent circuit of the device of FIG. 1.
Figure 3A:
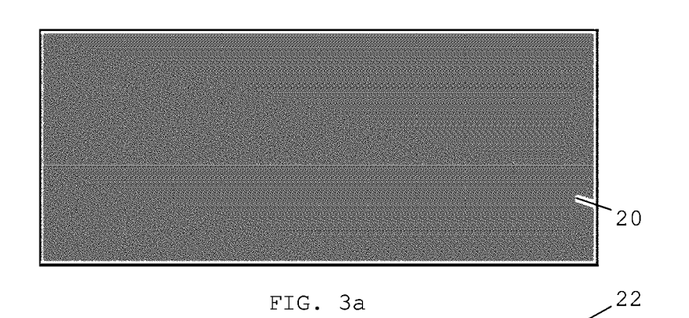
FIGS. 3a to 3f illustrate processes for fabricating a device including a diode according to some embodiments.
Figure 3B:
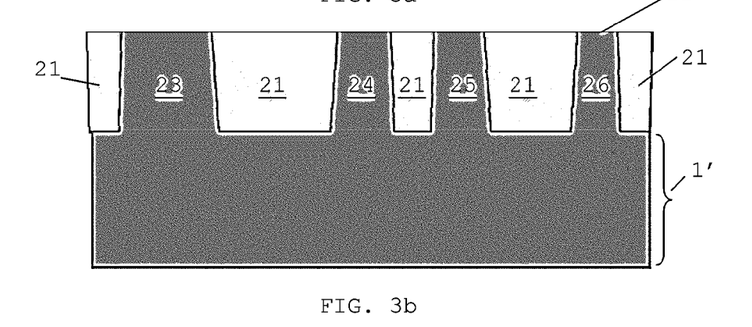
Figure 3C:
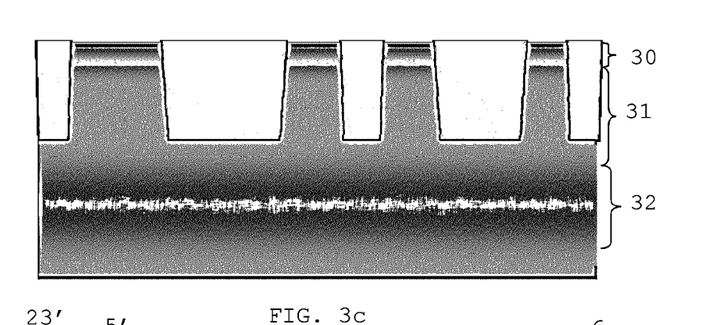
Figure 3D:
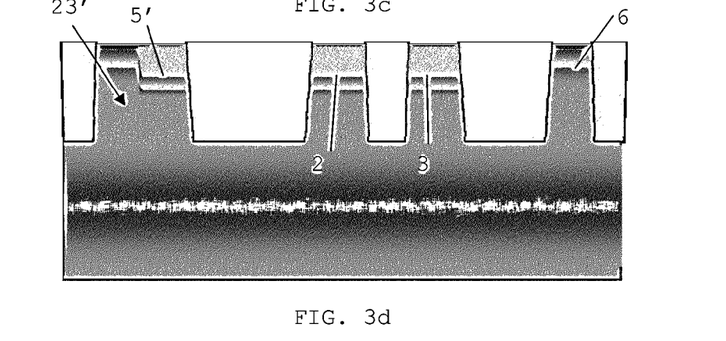
Figure 3E:
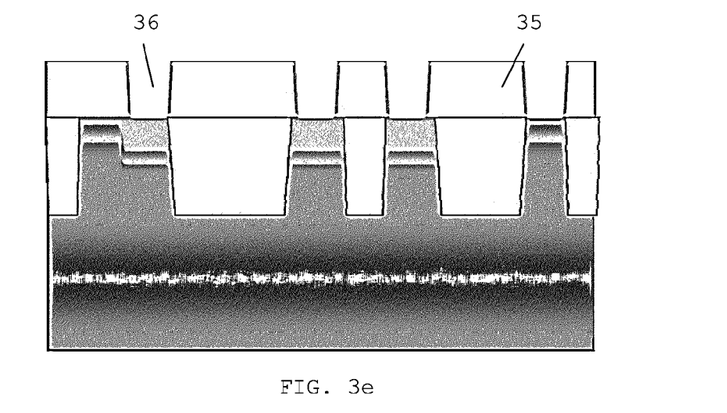
Figure 3F:
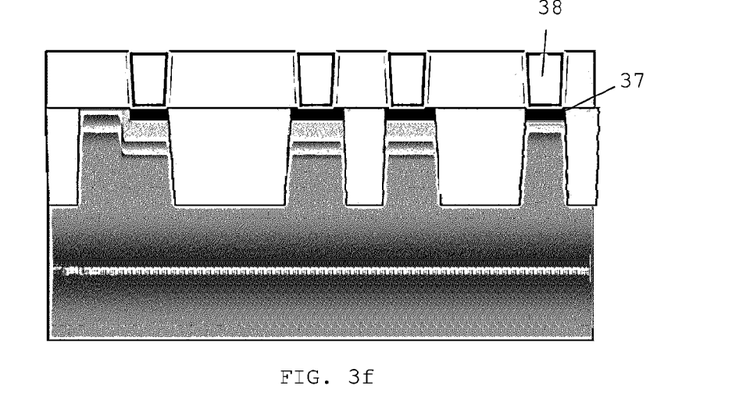

The p-n junction between the n-doped area 5 and the p-substrate 1 forms a diode 10. Region 5 represents the cathode, with region 8 (together with the bulk substrate area 1' and region 6) representing the anode. The external terminals of the diode are terminal 4 and the contact 15 to area 6. The diode 10 is configured to go into breakdown mode when the ESD terminal 4 receives a high voltage pulse, resulting in a current through the bulk of the substrate and the resistor 7, which triggers the npn into conductive mode in order to divert a high ESD current to ground. Area 8 is a highly doped p-implant, the so-called 'ESD implant', considered to be necessary when the p-doping level of substrate 1 is according to standard levels for p-well doping. These levels are such that the breakdown voltage of the diode junction is too high for efficient ESD operation. The addition of the ESD implant reduces the breakdown voltage of the diode, which is the holding voltage of the ESD protection device. The p-area 6 is obtained by a separate p-implant step at a higher doping level than the substrate, in order to obtain a good ohmic contact from the bulk to the contact area 9. FIG. 2 illustrates the equivalent circuit of this ESD protection device.

This structure as such is known in the art. The disclosed technology relates to a method for producing the structure that allows a reduction in the number of production steps, in particular in the number of steps requiring a mask. The disclosed technology is equally related to the device as such.

FIG. 3 illustrates the method according to a preferred embodiment. The method starts from a Si-substrate 20, possibly a high-resistance Si wafer (FIG. 3a), possibly a lowly p-doped or undoped substrate. According to a preferred embodiment, the Si-substrate is the Silicon top layer of a Silicon-on-Insulator (SOI) substrate. The substrate may be an interposer substrate for carrying IC's on its surface. In the next step, standard Shallow Trench Isolation (STI) process steps are applied to form field dielectric regions 21, and active areas 23, 24, 25 and 26, each pair of adjacent active areas being separated by a field dielectric region 21 (FIG. 3b). The substrate is planarized to form a flat top surface 22 that is common to the active areas and the field dielectric regions 21. The substrate area underneath the active areas and the field dielectric regions is referred to hereafter as the substrate bulk area 1'. Then a p-type implant is done (FIG. 3c) in two steps, to obtain a p-doping profile shown in FIG. 4. The profile shows a highly p-doped region 30 near the surface, exhibiting a maximum p-level at the surface, which gradually decreases at higher depths, a lower-doped region 31 underneath the high-doped region, where the doping level reaches a minimum, and again a more highly doped region 32 in the majority of the bulk area 1' of the substrate 20, where the doping level reaches again a maximum after which it diminishes again to a lower level at still higher depths. The second maximum in region 32 can be present in certain kinds of devices according to some embodiments, such as the device of FIG. 3. By way of example, the first region 30 may have a maximum dopant level of $1E19/cm^3$, the third region 32 may have a minimum dopant level of $2E17/cm^3$, with the middle region having a maximum level of $1E16/cm^3$. This p-type implant step will hereafter be referred to as a 'graded p-implant'. Further clarification on the characterization of the profile in terms of the separation between the higher and lower doped areas defined by the profile, the preferred ranges for the doping level, and their position with respect to the other components in the structure is given further in this text.

This is then followed by an n-implant step (FIG. 3*d*), performed through a mask (not shown) according to known practice, for creating the n-doped areas 2 and 3 in active areas 24 and 25, which will serve respectively as the collector and emitter of the bipolar transistor in the ESD protection device, and the n-doped area 5' in active area 23, which is to form the diode at the junction between this n-doped area 5' and the remainder 23' of the active area 23. The n-region 5' does not extend over the totality of the width of the active area 23, so that the junction between the n-doped area 5' and the remainder is at least partially formed along the perimeter (i.e. the lateral edge) of the n-doped area 5'.

After these steps, a layer of 'pre-metal dielectric' (PMD) 35 is deposited and patterned to form contact holes 36 (FIG. 3*e*), which are thereafter subjected to a silicidation step and via fill step (FIG. 3*f*) to form silicide areas 37 and contacts 38. The silicidation (as such known in the art, for example by depositing Ni and performing a heating step to form Ni-silicide) thus takes place after deposition of the PMD and formation of the holes 36, which is different from the process for producing the prior art device of FIG. 1, where silicidation is done before the contact formation. In the case of a device according to one embodiment, the order of these steps is changed to prevent the active area portion 23' from being subjected to silicidation. The ESD protection device is completed by producing the external connections to the terminal 4 and to ground (including resistor 7), in the same way as in the prior art device of FIG. 1.

Figure 5:
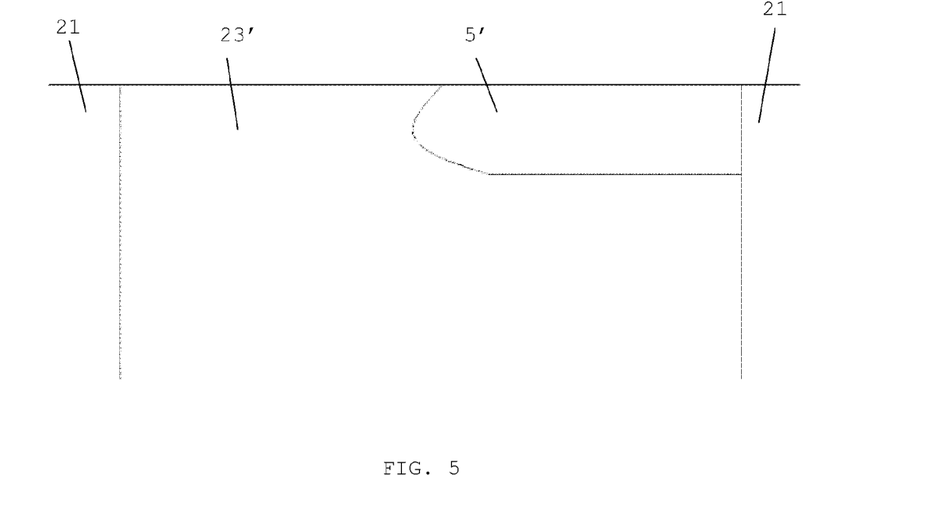
FIG. 5 illustrates the shape of the diode's p-n junction in a device fabricated according to an embodiment.

The characteristic feature according to some embodiments, which is the n-implant 5' being formed in only a part of the active area 23, in combination with the graded p-implant, has proven to be advantageous for the following reason. As shown in FIG. 5, the n-implant region 5' exhibits a rounded contact area with the surrounding p-doped area. This 'perimeter effect' creates a high electric field locally, which leads to a lower diode breakdown voltage and thus a lower holding voltage for the ESD, without requiring the 'ESD implant' of FIG. 1. The presence of the p-profile enhances this perimeter effect, due to the local increased p-doping level at the perimeter.

Figure 6:
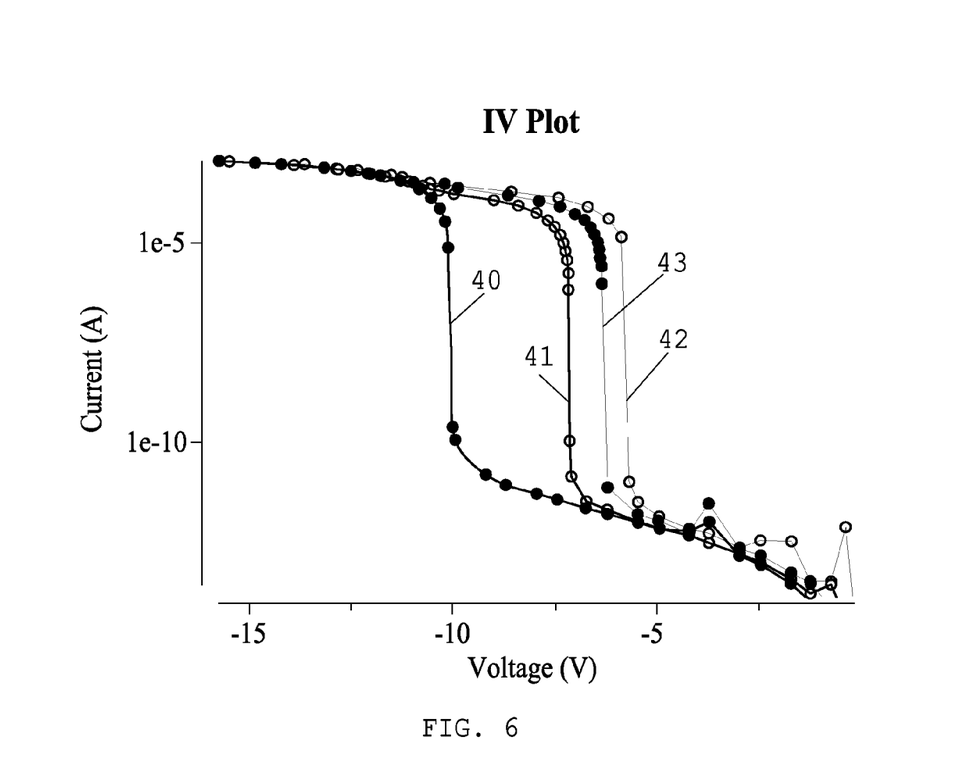
FIG. 6 illustrates the influence of the p-dopant level in the area adjacent to the n-doped area, on the tuning of the ESD protection device's holding voltage.

This approach thus allows to avoid the processing steps related to the ESD implant, thereby reducing the number of masks required in the process, and thus rendering the process more cost-effective. It was further determined that the holding voltage of the diode in the ESD protection device according to one embodiment can be tuned by changing the doping level of the p-implant in the region 30 closest to the substrate surface, and hence in the active area portion 23' adjacent to the n-region 5'. FIG. 6 illustrates the change of the holding voltage from the higher value (in absolute value) of about 10V to the lower value of around 5V when changing from the prior art approach of FIG. 1 (illustrated by the curve 40) to the approach according to one embodiment (curves 41 to 43). The variation between the curves 41-43 is due to a variation in the p-doping level in area 23'.

It was found also that in the case of the diode-triggered npn, the use of the graded p-implant leading to a higher p-level in the surface region 30 is sufficient for obtaining a desired contact resistance at the p-area 6 in active area 26. No separate p-implant in area 6 is required therefore if the graded p-implant is used. Another advantage of the graded p-implant is that the lowest p-doping level is reached in the vicinity of the junction between the n-doped areas 2,3 and the underlying p-doped material. This reduces the junction capacitance of these junctions. At the same time, the higher p-doping level in the bulk of the substrate, in region 32, increases the conductivity of this bulk area, resulting in a more efficient triggering of the ESD protection device.

Figure 7A:
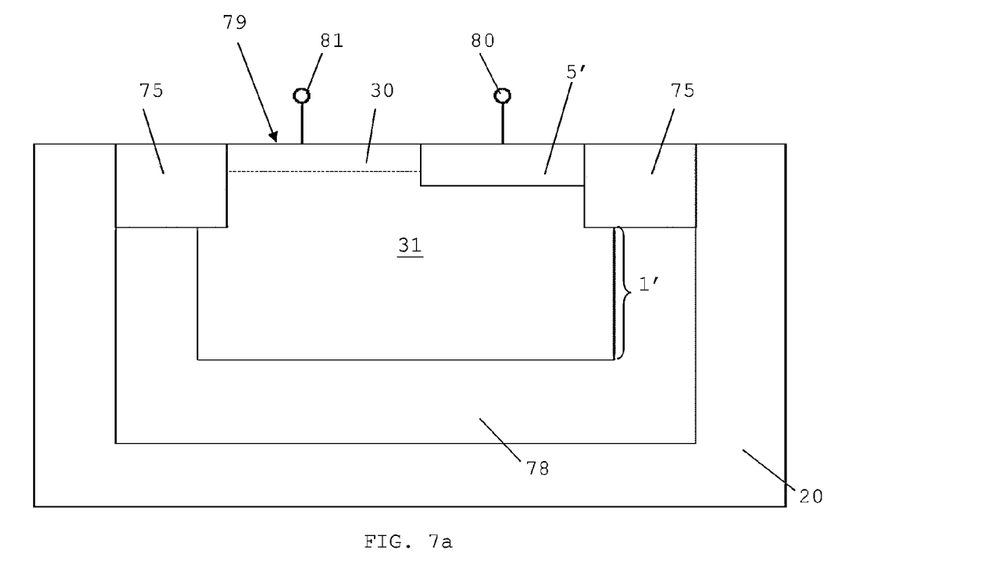
FIGS. 7a and 7b illustrate a surface diode structure according to an embodiment.

The embodiments disclosed herein are not limited to ESD protection devices as shown in FIG. 3, nor to ESD protection devices as such. The doping types n and p may be reversed in all of the above detailed description. N and P type doping are examples of the 'opposite doping types' referred to elsewhere in this description and in the claims. The embodiments are applicable to other devices than the diode-triggered npn device of FIG. 3. FIG. 7*a* shows a so-called 'surface diode' according to an embodiment, with the cathode and anode terminal contacting portions of the same active area 79, located between field dielectric regions 75. This is preferably a Zener diode applicable in any type of ESD protection device, wherein the reverse breakdown voltage is tuned through an adequate doping level near the surface of the active area. In this embodiment, the p-doped bulk substrate area 1' is itself surrounded by an n-well 78, created in a p-substrate 20. This is an example of a so-called triple well design, which is however not a requirement in the embodiments disclosed herein. The n-doped area 5' is again the cathode of the diode, connected to the cathode terminal 80, with the width of the n-doped area being smaller than the width of the active area 79 wherein it is produced. The anode terminal 81 is connected to the remainder of the active area 79. Cathode and anode terminals 80/81 are to be understood as including silicidation areas as shown in FIG. 1 for example. These areas are not drawn in FIG. 7 for reasons of simplicity.

This creates a so-called 'surface diode', with the majority of the current flowing in the upper region of the active area. The active area and bulk substrate are again provided with the graded p-implant described above, resulting in the upper region 30, which enhances the perimeter effect at the edge of the n-doped region 5' to such a degree that a lower breakdown voltage (in absolute value) is obtained compared to a vertical diode structure (with cathode and anode regions separated by a field dielectric and the cathode covering the complete width of the active area). In addition, the lower breakdown voltage may be tuned by adapting the doping level in region 30. Possibly, an additional doping implant may be done to obtain an area 6 at the anode terminal for improving the ohmic contact, see embodiment of FIG. 7*b*, but this may only be required for specific applications.

Figure 7B:
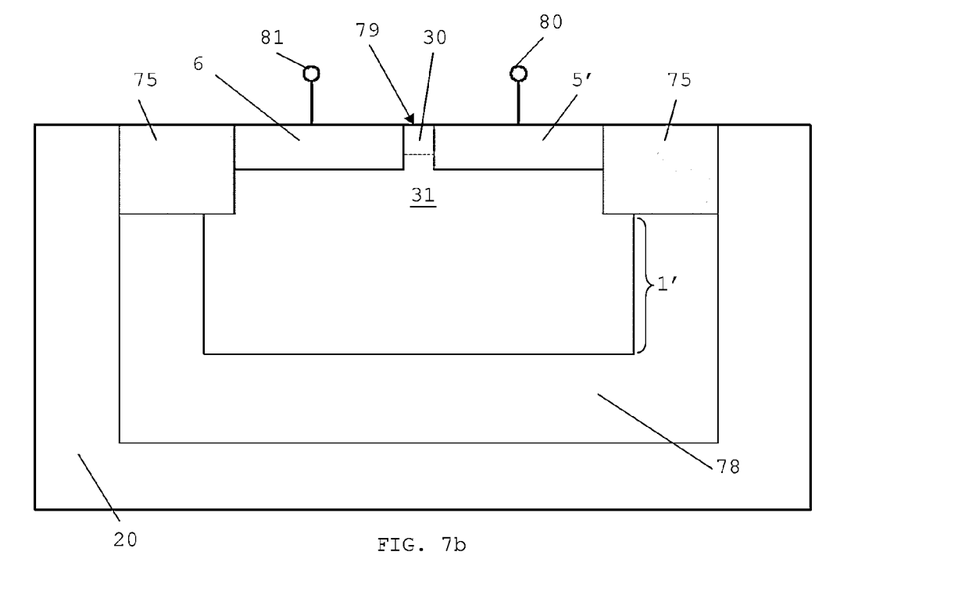

In the structure of FIGS. 7*a* and 7*b*, the graded profile does not include the higher doped region 32 in the bulk substrate area 1'. In order to enhance the perimeter effect, it is sufficient that a higher doping level is present near the perimeter of the cathode region 5', i.e. in region 30, then changing to a lower level in region 31, where it stays essentially constant at the bulk doping level at higher depths.

Figure 4:
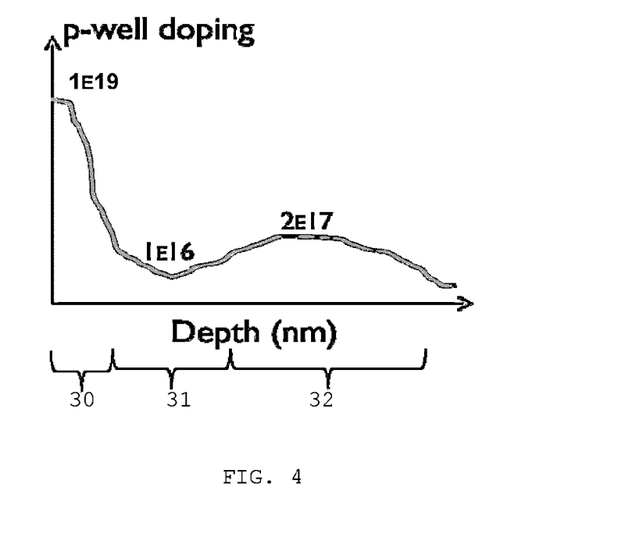
FIG. 4 shows an example of a p-doping profile according to a device fabricated according to an embodiment similar to FIG. 3c.

In any of the above references to a graded doping profile, it must be understood that there is not a sharp line between the various regions of different doping level defined by the profile. As illustrated in FIG. 4, the doping level changes gradually from a higher to a lower level or vice-versa, preferably according to a Gaussian distribution. According to a preferred embodiment, the minimum level of the profile (in region 31) is reached at a depth that is higher than half the depth of the doped area (5' in the above-described structures) for which the perimeter effect is to be enhanced. According to a further embodiment, the minimum is reached at a depth higher than the depth of the doped area 5'. According to another embodiment, the minimum is reached at a depth between half the depth and 1.5 times the depth of the doped area 5'. According to an embodiment, the minimum is reached at or essentially at the depth of the doped area 5'. The depth of the area 5' for which the perimeter effect is to be enhanced can be determined as the depth at which a junction appears between the area and the underlying material of opposite doping type.

Preferred ranges for the maximum doping levels in the profile are the following:
For the maximum at the surface of the active area (region 30): between $2E18/cm^3$ and $4E19/cm^3$.
For the minimum in the region 31 underneath the top region: between $1E16/cm^3$ and $5E17/cm^3$.
For the maximum in the third region 32 (if present): between $1E16/cm^3$ and $1E18/cm^3$.

The depth of the field dielectric regions 21 or 75 may be between 250 nm and 350 nm. The depth of the upper region 5' of which the perimeter effect is to be enhanced may be between 75 nm and 125 nm. The maximum depth of the graded implant in three regions 30-31-32 may be between 400 and 700 nm. The depth of the first region 30 may be between 20 nm and 50 nm, measured for example as the depth at which the doping level reaches the middle value between the maximum level at the surface and the minimum level in region 31 (i.e. (max+min)/2). These values are according to preferred embodiments, and do not limit the scope of the invention. The combination of a doped area having a perimeter with the surrounding material of opposite doping type with a graded doping profile can be applied in other types of devices, for example in a Silicon controlled rectifier.

When it is stated in this description and in the claims that the upper portion 5' of the active area 23 or 79 is smaller in width than the active area itself, this characteristic is not limited to active areas of constant width as seen in the direction perpendicular to the drawings (i.e. an active area formed between two parallel lines. It is sufficient that the width of the upper portion 5' is smaller than the width of the active area in every cross section of at least a portion of the active area, and in the portion, the width of the active area and of the upper portion 5' may differ from one section to the next, as long as in every one of the sections, the width of the upper portion is smaller than the width of the active area.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

Unless specifically specified, the description of a layer being deposited or produced 'on' another layer or substrate, includes the options of
the layer being produced or deposited directly on, i.e. in contact with, the other layer or substrate, and
the layer being produced on one or a stack of intermediate layers between the layer and the other layer or substrate.

What is claimed is:

1. A semiconductor electrostatic discharge (ESD) protection device comprising;
a bulk substrate area;
a plurality of field dielectric regions formed over the bulk substrate area;
a plurality of active areas formed between adjacent field dielectric regions, wherein at least a part of one of the active areas and at least a part of the bulk substrate area are formed of a material of a first doping type;
an upper portion formed in the one of the active areas and formed of a material of a second doping type opposite to the first doping type, the upper portion having a width smaller than a width of the active area,
wherein a diode is formed in the active area of the device, the diode comprising at least part of a junction formed between the upper portion of the active area and a remainder of the active area,
wherein the upper portion is connected to a first terminal and the remainder of the active area is connected to a second terminal,
wherein the remainder of the active area and the bulk substrate area have a doping profile of the first doping type, wherein the doping profile has a first maximum value at a surface of the active area and changes to a minimum value at a first depth within the active area, and wherein the doping profile further changes to a second maximum value at a second depth greater than the first depth and within the bulk substrate area; and
a bipolar junction transistor including:
a second area formed in a second active area configured as an emitter; and
a third area formed in a third active area configured as a collector,
wherein the emitter and the collector are formed of materials of the second doping type of the upper portion of the one of the active areas, and
wherein the bipolar junction transistor is configured to conduct current from the first terminal to a ground once the diode enters a breakdown mode.

2. The device of claim 1, wherein the second terminal is connected to a surface of the remainder of the active area.

3. The device of claim 1, wherein the one of the active areas is a first active area, and wherein the second terminal is connected to a surface of a second active area formed of a material of the first doping type.

4. The device of claim 1, wherein the device is formed on an interposer substrate on which one or more integrated circuit chips are mounted, the ESD protection device being configured to protect an electrical connection of an IC from an electrostatic discharge event.

5. The device of claim 1, wherein the semiconductor device is formed of silicon, the upper portion being n-doped and the remainder of the active area being p-doped.

6. The device of claim 1, wherein the first depth at which the doping profile has the minimum doping level is greater than about half of a depth of the upper portion.

7. A method of fabricating a semiconductor electrostatic discharge (ESD) protection device, the method including:
   providing a semiconductor substrate;
   forming a plurality of field dielectric regions and at least one active area between two adjacent field dielectric regions, wherein the at least one active area and the field dielectric regions are formed over a bulk substrate area;
   forming an area of a first doping type in the substrate, the area comprising the at least one active area and the bulk substrate area;
   forming an upper portion of a second doping type opposite to the first doping type in the one of the active areas, wherein the upper portion has a width smaller than a width of the at least one active area;
   connecting the upper portion to a first terminal;
   connecting a remainder of the active area to a second terminal,
   wherein a diode is formed by at least part of a junction formed between the upper portion and the remainder of the active area, and
   wherein forming the area of the first doping type comprises implanting the substrate with dopants of the first type to create a doping profile in the active area and the bulk substrate area, such that the doping profile has a first maximum level at a surface of the active area and changes to a minimum level at a first depth within the active area, and wherein the doping level further changes to a second maximum value at a second depth greater than the first depth and within the bulk substrate area; and
   forming a bipolar junction transistor, including:
      forming a second area in a second active area configured as an emitter; and
      forming a third area formed in a third active area,
      wherein a dopant of the second type are incorporated in the upper portion and the second and third active areas simultaneously to form the emitter and the collector.

8. The method of claim 7, wherein the second terminal is connected to a surface of the remainder of the active area.

9. The method of claim 7, wherein the active area is a first active area, and wherein the second terminal is connected to a surface of a second active area of a same doping type as the first active area.

10. The method of claim 7, wherein connecting the upper portion to the first terminal and connecting the remainder of the active area to the second terminal comprises:
   depositing a pre-metal dielectric (PMD);
   patterning the PMD to form contact holes;
   forming contacts by filling the holes with a contact metal; and
   forming silicide areas between the active areas and the contact metal,
   wherein forming the silicide area is performed after the patterning the PMD and prior to forming the contacts.

11. The method of claim 7, wherein the first depth at which the minimum doping level is reached is greater than about half of a depth of the upper portion.

* * * * *